US006794282B2

(12) United States Patent
Goebel et al.

(10) Patent No.: US 6,794,282 B2
(45) Date of Patent: Sep. 21, 2004

(54) THREE LAYER ALUMINUM DEPOSITION PROCESS FOR HIGH ASPECT RATIO CL CONTACTS

(75) Inventors: Thomas Goebel, Regensburg (DE); Werner Robl, Poughkeepsie, NY (US); Rajeev Malik, Pleasantville, NY (US); Mihel Seitz, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/305,063

(22) Filed: Nov. 27, 2002

(65) Prior Publication Data

US 2004/0102001 A1 May 27, 2004

(51) Int. Cl.[7] .............................................. H01L 21/44
(52) U.S. Cl. ...................... 438/597; 438/652; 438/688
(58) Field of Search ............................ 438/584, 597, 438/652, 688, 238, 618, 629, 631, 633, 636, 638, 639, 641, 645, 646, 654, 658, 659, 660, 666, 672, 674, 679, 687; 204/192.15, 192.17; 427/97, 457, 523, 528; 257/E21.588

(56) References Cited

U.S. PATENT DOCUMENTS

| 5,108,570 A | * | 4/1992 | Wang ...................... 204/192.3 |
| 5,139,971 A | * | 8/1992 | Giridhar et al. ............ 438/622 |
| 5,543,357 A | * | 8/1996 | Yamada et al. ............. 438/646 |
| 5,807,760 A | | 9/1998 | Buckfeller et al. ......... 438/636 |
| 5,959,361 A | * | 9/1999 | Huang et al. ............... 257/774 |
| 6,136,709 A | | 10/2000 | Schmidbauer .............. 438/688 |
| 6,140,228 A | * | 10/2000 | Shan et al. .................. 438/653 |
| 6,169,030 B1 | | 1/2001 | Naik et al. |
| 6,352,944 B1 | | 3/2002 | O'Sullivan et al. ......... 438/778 |
| 6,444,571 B1 | | 9/2002 | Yamamoto |
| 6,458,684 B1 | | 10/2002 | Guo et al. |
| 6,597,042 B1 | * | 7/2003 | Honeycutt et al. .......... 257/382 |

FOREIGN PATENT DOCUMENTS

JP          04092418 A  *  3/1992    ......... H01L/21/285

OTHER PUBLICATIONS

Cheung, et al., "Improved CVD Aluminum Deposition Using In–Situ Sputtered Nucleation Layers," VMIC Conference, Jun. 12–13, 1990, pp. 303–309.
Nguyen, S.V., "High–Density Plasma Chemical Vapor Deposition of Silicon–Based Dielectric Films for Integrated Circuits," IBM Journal of Research Development, vol. 43, No 1/2, Jan./Mar. 1999, pp. 109–126.

* cited by examiner

Primary Examiner—George Fourson
Assistant Examiner—Brook Kebede
(74) Attorney, Agent, or Firm—Slater & Matsil, L.L.P.

(57) ABSTRACT

A method of forming a semiconductor device includes providing a semiconductor device including a conductor formed thereon. A dielectric layer is formed over the conductor and a recess is formed in the dielectric layer by removing a portion of the dielectric layer to expose at least a portion of the conductor. A first layer of aluminum is deposited over the top surface of the dielectric, along the sidewalls of the dielectric layer and over the exposed portion of the conductor without altering the temperature of the semiconductor device. A second layer of aluminum is deposited over the first layer of aluminum at a temperature greater than about 300° C. A third layer of aluminum is deposited over the second layer of aluminum so as to completely fill the recess in the dielectric layer. The third layer of aluminum is slow deposited at a temperature greater than about 300° C.

35 Claims, 1 Drawing Sheet

THREE LAYER ALUMINUM DEPOSITION PROCESS FOR HIGH ASPECT RATIO CL CONTACTS

BACKGROUND OF THE INVENTION

1. Field of the Invention

The invention relates to DRAM fabrication and more particularly, to a process for forming a DRAM by utilizing a three layer aluminum deposition for contact levels (CL) for Al fill for the generation of 70 nm or 90 nm groundrule devices.

2. Description of the Related Art

DRAM devices, such as semiconductor memories, processors, integrated circuits and the like, include layers of contact levels (CL) used to interconnect layers of metal. These conductive or metal lines (ML) are often formed on upper levels of a semiconductor device, and these metal lines are generally connected by contacts through vias to underlying devices or other metal lines.

In the typical method, an Aluminum (Al) metal line deposition includes a two step process, and this process is a cold-hot process. The cold-hot process is extremely slow and has a throughput of only about 22 wafers per hour for a two physical vapor deposition (PVD) Al chamber main frame. The cold-hot process includes two depositions (cold and hot). The first or cold deposition suffers from the disadvantage of running unchucked, meaning that there is no opportunity to check whether the wafer is sitting correctly on the chuck that secures the wafer in a processing chamber.

If the wafer is not placed correctly on the chuck, the chuck may get deposited upon and ruined. This is disadvantageous since an electrostatic chuck is very expensive.

A further problem with the conventional cold-hot process is the heat-up time needed in between the two Al depositions. After the cold Al deposition, the wafer is heated. However, during that time, a thin $Al_3O_2$ layer may be formed on the prior deposited Al, and this increases the contact resistance.

The cold-hot process sequence may employ a sprint approach wherein a via has to get filled and concurrently a planar Al film is deposited. The planar Al film is then etched for structuring metal lines.

Requirements for the Al deposition may include the following steps:
a) vias formed in a dielectric (oxide) layer that are tapered to get filled reliably;
b) a planar or low topography Al film is formed on top of the dielectric layer; and
c) a temperature budget for semiconductor processing is maintained (i.e., little or no influence on sub lying metal lines).

Towards this end, a two step Al deposition process was developed.

The two step process begins with a cold step that uses high sputter power and runs at low temperatures to ensure that the vias are getting filled (i.e., small Al grains and no overhangs at the top edge of the vias), and that no voids are formed. Before the second or hot Al deposition step starts, the wafer temperature is increased up to 350° C.

This second Al deposition process runs at low power to ensure that the Al film gets planarized during deposition, however; this Al deposition sequence is not a reflow process.

Reflow processes generally run at much higher temperatures and were developed for filling more aggressive (higher aspect ratio) via structures. Accordingly, the hot Al deposition process has to fulfill different requirements and is optimized for tapered via fill and planar Al deposition on top of a dielectric layer.

The conventional two-step deposition process is very slow due to the relatively long Al deposition time and a small amount of $TiAl_3$ forms which increases contact resistance and decreases the electromigration lifetime.

In general, in the conventional processes, the actual process of preparing the DRAM, the CL and ML requires an Al fill during a two step PVD process, as already mentioned; however, the first step is a non-chucked PVD to create small grains at the bottom of the CL, and the second step, which is performed at about 350° C. sputters the deposit to the remaining thickness. Nevertheless, this two-step process is inadequate to fulfill the challenges needed due to the increasing aspect ratios that are necessary to make a void-free Al fill.

U.S. Pat. No. 5,807,760 disclose a method of preparing semiconductor integrated circuit fabrications by:

preheating a substrate having partially formed integrated circuits thereon by exposing it to an ambient environment at 150°–200° C.;

commencing the deposition of an aluminum-rich layer, the deposition taking place in an ambient environment at a temperature, t, where 350° C.$\leq$t$\leq$400° C.; the temperature of the substrate gradually increasing during the deposition; and further including the step of depositing an anti-reflective coating upon the deposited metal, the deposition of anti-reflective coating taking place upon a support structure maintained at a constant temperature.

The deposition of an aluminum nitride comprising layer over a semiconductor substrate in preparing DRAM circuitry is disclosed in U.S. Pat. No. 6,352,944 B1. The process entails:

positioning a semiconductor substrate within a chemical vapor deposition reactor; and feeding ammonia and at least one compound of the formula $R_3Al$, where "R" is an alkyl group or a mixture of alkyl groups, to the reactor while the, semiconductor substrate is at a temperature of less than 500° C. and at a reactor pressure from about 100 mTorr to about 725 Torr effective to deposit a layer comprising substantially amorphous aluminum nitride over the semiconductor substrate at the reactor temperature and the reactor pressure.

U.S. Pat. No. 6,136,709 disclose a metal line one step deposition process for semiconductor devices comprising:

providing a semiconductor wafer including a dielectric layer formed on the semiconductor wafer, the dielectric layer having vias formed therein;

placing the semiconductor wafer on a thermal surface in a deposition chamber;

heating the semiconductor wafer to a first temperature by employing the thermal surface;

depositing a metal on the semiconductor wafer to concurrently fill the vias and cover a top surface of the dielectric layer wherein the metal depositing is initiated when the semiconductor wafer is at the first temperature and the metal depositing is continued while heating the semiconductor wafer to a target temperature which is greater than the first temperature; and controlling an intermediate temperature of the semiconductor wafer between the first temperature and the target temperature by programming a thermal gradient in the thermal surface on which the semiconductor wafer is mounted in the deposition chamber.

There is a need to improve the process of depositing aluminum layers for conductive lines for an Al fill for smaller groundrule devices, wherein the ground rules are about 70 nm or about 90 nm to meet the challenges of the increasing aspect ratios for conductive lines that require a void-free Al fill, and for which the two-step PVD process is inadequate.

SUMMARY OF THE INVENTION

One object of the present invention is to provide a three layer aluminum deposition process for high aspect ratio CL contacts to accommodate increasing aspect ratios for the CL so as to make a void-free Al fill, and thereby satisfy the challenge for the DRAM generation of about 70 nm or about 90 nm ground rules.

A further object of the present invention is to provide a three layer aluminum deposition process for high aspect ratio CL contacts, wherein the process starts with a cold deposition followed by relatively thin 250 nm thick hot layer deposition that is sputtered to provide a reflow on the hot chuck, and following the reflow, a third part of the Al PVD is performed.

In general, the three layer aluminum deposition process for preparing high aspect ratio CL contacts of the invention is accomplished by:

a) introducing a semiconductor wafer into a deposition chamber, said semiconductor comprising a bottom layer of an intermetal dielectric, a target layer intermetal dielectric patterned to form a trench that includes contact holes or vias and/or conductive line openings disposed on said bottom inter metal dielectric, said target layer further including a target conductor or metal layer, said target conductor or metal layer is a substrate having diffusion regions therein or conductive lines formed thereon;

b) cold depositing a first Al layer unchucked on the bottom and sidewalls of the via and on top of the target layer using high sputter power and low temperatures due to absence of heating said wafer;

c) hot depositing a thin second Al layer on said first Al layer at a temperature greater than about 300° C. to cause reflow of the second Al layer on a hot chuck to provide improved sidewall coverage and a thin continuous seed layer for a subsequent third layer Al deposition; and d) after the reflow in step c) hot depositing slowly a third Al layer on said second Al layer at a temperature greater than about 300° C. to cause reflow of the third Al layer on the hot chuck to fill the contact hole without a void.

DETAILED DESCRIPTION OF PREFERRED EMBODIMENT OF THE INVENTION

Figure 1:
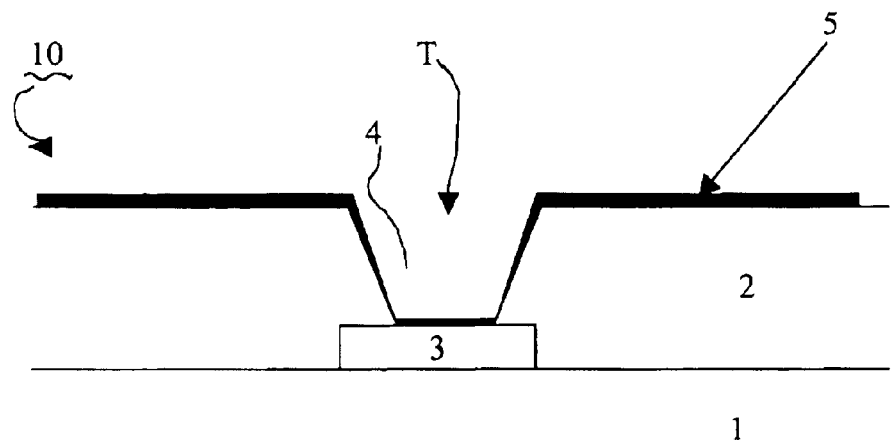
FIG. 1 is an illustrative depiction of a partial cross-sectional view of a semiconductor wafer formed from the invention process, after the first step of cold deposition of a very thin aluminum layer.

Reference is now made to FIG. 1 which is an illustrative depiction of a partial cross-sectional view of a semiconductor wafer 10. Wafer 10 includes a semiconductor memory chip, such as a dynamic random access memory (DRAM). The wafer as provided in the processing chamber (not shown) is at a stage such that it comprises a bottom layer of an intermetal dielectric 1 which preferably comprise $SiO_2$ or a low-k -material. A target layer 2 is disposed on the bottom intermetal dielectric layer 1, and the target layer 2 comprises an intermetal dielectric, which is preferably $SiO_2$ or a low-k -material. The target layer further includes a target conductor or metal layer 3 which is preferably composed of aluminum or copper which is a substrate having diffusion regions formed therein or conductive lines formed thereon. As may be seen from FIG. 1, the intermetal dielectric layer 2 is patterned to form a trench T and the trench may include contact holes or vias 4 and/or conductive line openings. For example, conductive lines may be formed in the trench or in dielectric layer 2. In the preferred embodiment of the invention process, vias 4 are formed in the trench T while metal lines are formed on the surface of dielectric layer 2. The via 4 exposes portions of the underlying conductive material of target layer 2. The process begins with a cold step deposition of Al which uses high sputter power and runs at low temperatures, to provide a thin first aluminum layer 5 as a deposit into the bottom and sidewalls of the via 4 and on top of the dielectric layer 2, as shown in FIG. 1. This first or cold step deposition of Al is performed unchucked, meaning that there is no possibility of checking whether the wafer is sitting correctly on the chuck that holds the wafer in a processing chamber. The cold deposition formed in the first step to provide a thin aluminum layer is performed in the deposition chamber without employing a thermal surface to alter the temperature of the wafer installed therein.

Figure 2:
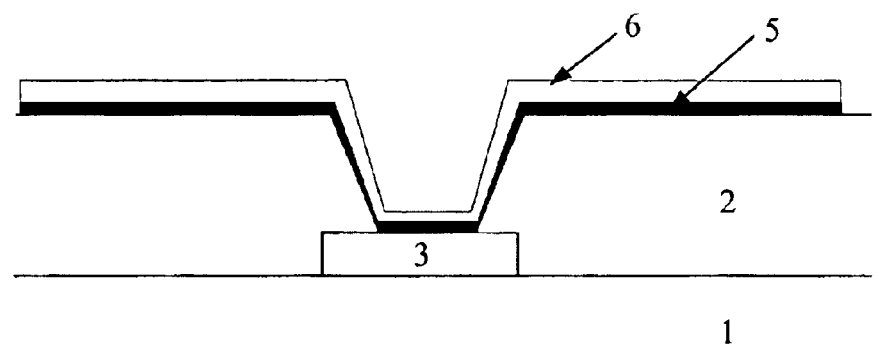
FIG. 2 is an illustrative depiction of a partial cross-sectional view of a semiconductor wafer formed from the second step of the invention process wherein, after hot deposition of the second aluminum layer and reflow of this layer on a hot chuck, the sidewall coverage is improved to provide a continuous seed layer preparatory to the third aluminum deposition step.

Next, referring to FIG. 2, a hot deposition of the second layer of aluminum deposition 6 is performed at a temperature greater than about 300° C. The second or hot Al deposition step is caused by heating the wafer temperature in excess of 300° C. prior to commencement of the second Al deposition step. The second Al deposition step is run at low power and the wafer is heated by a thermal surface (not shown) that includes a chuck for securing the wafer. After the hot deposition at temperatures greater than about 300° C. and formation of the second aluminum layer 6, a reflow of this layer is caused on the hot chuck where the wafer is brought into contact with a thermal surface and the thermal surface is heated to bring about a temperature in excess of 300° C. The hot chuck deposition of the second aluminum layer and reflow of this layer on the hot chuck provides improved sidewall coverage and gives a continuous seed layer, preparatory to the third aluminum deposition. In reality, the two layers formed by the cold deposition step and the hot deposition step are indistinguishable after formation of the second aluminum layer.

Figure 3:
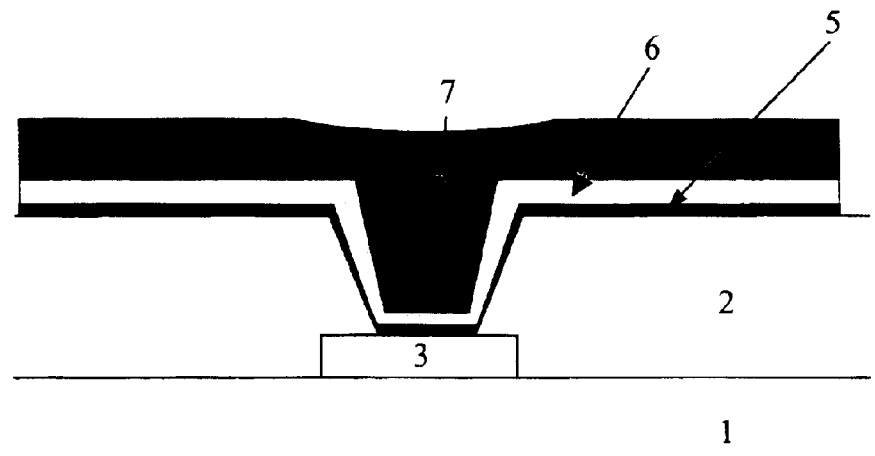
FIG. 3 is an illustrative depiction of a partial cross-sectional view of a semiconductor wafer formed from the third step of the invention process wherein, after a slow and hot deposition of the third aluminum layer, the contact hole is filled with aluminum to provide a void-free fill.

To affect filling of the contact hole without a void, as can be seen in FIG. 3, a third slow and hot deposited aluminum layer 7 is deposited by PVD at a temperature greater than about 300° C. to cause reflow of the third aluminum layer on the hot chuck, whereupon the contact hole or via 4 is filled without a void. Again, in reality, the three aluminum layers formed by this process are indistinguishable.

In the context of the invention, the intermetal dielectric layer 2, in addition to being $SiO_2$ or a low-k material may include a nitride or an organic layer, such as a resist or polyamide.

While the invention process has been described with reference to preferred embodiments pertaining to the three layer aluminum deposition process for high aspect ratio CL contacts, this description is illustrative and not limiting and many modifications and variations may be made by a person skilled in the art in light of the above teaching without departing from the spirit and scope of the invention, which is defined hereinafter by the appended claims.

What is claimed is:

1. A process for preparing contact layer (CL) contacts for DRAM products filled with aluminum by physical vapor deposition (PVD), the process comprising:
    a) introducing a se conductor wafer into a deposition chamber, said semiconductor wafer comprising a bottom layer of an intermetal dielectric, a target layer intermetal dielectric patterned to form a trench that includes contact holes or vias and/or conductive line openings disposed on said bottom layer of intermetal dielectric, said target layer further including a target conductor or metal layer,
    b) cold depositing a first Al layer unchucked on the bottom and sidewalls of the trench and on top of the target layer using high sputter power and low temperatures due to absence of heating said semiconductor wafer;
    c) hot depositing a second Al layer on said first Al layer at a temperature greater than about 300° C. to cause reflow of the second Al layer, the reflow being caused on a hot chuck where the semiconductor brought into contact with a thermal surface and the thermal surface is heated to bring about a temperature in excess of 300° C.; and
    d) after the reflow in step c), hot depositing slowly a third Al layer on said second Al layer at a temperature greater about 300° C. to cause reflow of the third Al layer on the hot chuck to fill the contact hole without a void.

2. The process of claim 1 wherein said bottom layer of intermetal dielectric is selected from $SiO_2$ or a low k-material.

3. The process of claim 2 wherein said target layer of intermetal dielectric is selected from $SiO_2$ of a low k-material.

4. The process of claim 3 wherein said target conductor or metal layer is selected from aluminum or copper.

5. The process of claim 4 wherein, in step c) said hot deposited thin second Al layer is deposited by sputtering.

6. The process of claim 5 wherein said sputtered hot deposited thin second Al layer has a thickness of about 250 nm.

7. The process of claim 6 wherein in step d) hot depositing slowly said third Al layer is by PVD.

8. A method of forming a conductor in a semiconductor device, the method comprising:
    providing semiconductor wafer including a dielectric layer formed thereon;
    without heating the semiconductor wafer, depositing a first layer of aluminum on a surface of the dielectric layer;
    heating the semiconductor wafer, including the first layer of aluminum, to a temperature greater than about 300° C.;
    depositing a second layer of aluminum on the first layer of aluminum while the semiconductor wafer remains heated;
    reflowing the second layer of aluminum: and
    after depositing and reflowing the second layer of aluminum, slow depositing a third layer of aluminum at a temperature greater than about 300° C.

9. The method of claim 8 wherein depositing a first aluminum layer comprises depositing the aluminum layer by physical vapor deposition using a high sputter power.

10. The method of claim 8 and further comprising reflowing the second layer of aluminum prior depositing the third layer of aluminum.

11. The method of claim 8 wherein the dielectric layer comprises $SiO_2$.

12. The method of claim 8 wherein the dielectric layer comprises a low k-material.

13. The method of claim 8 wherein the second aluminum layer is deposited by sputtering.

14. The method of claim 8 wherein the third aluminum layer is deposited by physical vapor depositing.

15. The method of claim 8 wherein the semiconductor device comprises a DRAM device.

16. A method of forming a semiconductor device, the method comprising:
    providing a semiconductor device including a conductor formed thereon;
    forming a dielectric layer over the conductor, the dielectric layer including a top surface;
    forming a recess in the dielectric layer by removing a portion of the dielectric layer to expose at least a portion of the conductor and sidewalls of the dielectric layer;
    depositing a first layer of aluminum over the top surface of the dielectric, along the sidewalls of the dielectric layer over the exposed portion of the conductor, the first layer of aluminum being deposited without altering the temperature of the semiconductor device;
    depositing a second layer of aluminum over the first layer of aluminum, the second layer of aluminum being deposited at a temperature greater than about 300° C.;
    reflowing the second layer of aluminum; and
    forming a slow and hot deposited aluminum layer by depositing a third layer of aluminum over the second layer of aluminum so as to completely fill the recess in the dielectric layer, the third layer of aluminum being deposited at a temperature greater than about 300° C.

17. The method of claim 16, wherein the conductor comprises a metal.

18. The method of claim 17 wherein the conductor comprises aluminum.

19. The method of claim 17 wherein the conductor comprises copper.

20. The method of claim 16 wherein the conductor comprises a diffusion region.

21. The method of claim 16 wherein forming a dielectric layer comprises forming an oxide layer.

22. The method of claim 21 wherein forming a dielectric layer comprises forming $SiO_2$.

23. The method of claim 16 wherein forming a dielectric layer comprises forming a low-k material layer.

24. The method of claim 16 wherein forming a dielectric layer comprises forming a nitride layer.

25. The method of claim 16 wherein forming a dielectric layer comprises forming an organic layer.

26. The method of claim 16 wherein removing a portion of the dielectric layer comprises forming a trench within the dielectric layer.

27. The method of claim 26 wherein removing a portion of the dielectric layer further comprises forming a via within the trench.

28. The method of claim 16 wherein removing a portion of the dielectric layer comprises forming a via within the dielectric layer.

29. The method of claim 16 wherein the conductor is disposed on an intermetal dielectric layer.

30. The method of claim 29 wherein the intermetal dielectric layer comprises a low-k material.

31. The method of claim 16 wherein depositing a first aluminum layer comprises depositing the first aluminum layer by physical vapor deposition using a high sputter power.

32. The method of claim 16 and further comprising reflowing the second layer of aluminum prior depositing the third layer of aluminum.

33. The method of claim 16 wherein the second aluminum layer is deposited by sputtering.

34. The method of claim 16 wherein the third aluminum layer is deposited by physical vapor depositing.

35. The method of claim 16 wherein the semiconductor device comprises a DRAM device.

* * * * *

UNITED STATES PATENT AND TRADEMARK OFFICE
CERTIFICATE OF CORRECTION

PATENT NO. : 6,794,282 B2
DATED : September 21, 2004
INVENTOR(S) : Goebel et al.

It is certified that error appears in the above-identified patent and that said Letters Patent is hereby corrected as shown below:

Column 5,
Line 36, "se conductor" should read -- semiconductor --;
Line 66, "of" should read -- or --;

Column 6,
Line 58, insert -- and -- after "layer";

Column 8,
Line 17, insert -- to -- after "prior";

Signed and Sealed this

First Day of February, 2005

JON W. DUDAS
*Director of the United States Patent and Trademark Office*